(12) United States Patent
Koevoets et al.

(10) Patent No.: US 9,618,859 B2
(45) Date of Patent: Apr. 11, 2017

(54) LITHOGRAPHIC APPARATUS AND DEVICE MANUFACTURING METHOD

(71) Applicant: ASML Netherlands B.V., Veldhoven (NL)

(72) Inventors: Adrianus Hendrik Koevoets, Mierlo (NL); Sjoerd Nicolaas Lambertus Donders, Vught (NL); Jan Bernard Plechelmus Van Schoot, Eindhoven (NL); Koen Jacobus Johannes Maria Zaal, Eindhoven (NL); Theodorus Petrus Maria Cadee, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 82 days.

(21) Appl. No.: 14/375,457

(22) PCT Filed: Jan. 25, 2013

(86) PCT No.: PCT/EP2013/051480
§ 371 (c)(1),
(2) Date: Jul. 30, 2014

(87) PCT Pub. No.: WO2013/113634
PCT Pub. Date: Aug. 8, 2013

(65) Prior Publication Data
US 2014/0340659 A1 Nov. 20, 2014

Related U.S. Application Data (60) Provisional application No. 61/592,243, filed on Jan. 30, 2012, provisional application No. 61/652,924, (Continued)

(51) Int. Cl.
*G03B 27/52* (2006.01)
*G03F 7/20* (2006.01)

(52) U.S. Cl.
CPC ........ *G03F 7/70891* (2013.01); *G03F 7/7085* (2013.01); *G03F 7/70266* (2013.01);
(Continued)

(58) Field of Classification Search
CPC ............. G03F 7/70266; G03F 7/70775; G03F 7/70833; G03F 7/7085; G03F 7/70858; G03F 7/70891
(Continued)

(56) References Cited

U.S. PATENT DOCUMENTS

| 5,610,715 A | 3/1997 | Yoshii et al. |
| 6,359,678 B1 | 3/2002 | Ota |

(Continued)

FOREIGN PATENT DOCUMENTS

| EP | 2 515 170 A2 | 10/2012 |
| JP | 05-62871 A | 3/1993 |

(Continued)

OTHER PUBLICATIONS

International Search Report directed to related International Patent Application No. PCT/EP2013/051479, mailed Jul. 8, 2013; 3 pages.
(Continued)

*Primary Examiner* — Peter B Kim
(74) *Attorney, Agent, or Firm* — Sterne, Kessler, Goldstein & Fox P.L.L.C.

(57) ABSTRACT

A lithographic apparatus component, such as a metrology system or an optical element (e.g., a mirror) is provided with a temperature control system for controlling deformation of the component. The control system includes channels provided close to a surface of the component through which a two phase cooling medium is supplied. The metrology system measures a position of at least a moveable item with respect to a reference position and includes a metrology frame connected to the reference position. An encoder is
(Continued)

connected to the moveable item and constructed and arranged to measure a relative position of the encoder with respect to a reference grid. The reference grid may be provided directly on a surface of the metrology frame. A lithographic projection apparatus may have the metrology system for measuring a position of the substrate table with respect to the projection system.

20 Claims, 5 Drawing Sheets

Related U.S. Application Data filed on May 30, 2012, provisional application No. 61/710,288, filed on Oct. 5, 2012.

(52) U.S. Cl.
CPC ...... *G03F 7/70775* (2013.01); *G03F 7/70833* (2013.01); *G03F 7/70858* (2013.01)

(58) Field of Classification Search
USPC .......................................................... 355/30
See application file for complete search history.

(56) References Cited

U.S. PATENT DOCUMENTS

| | | | |
|---|---|---|---|
| 7,740,362 B1 | 6/2010 | Neil et al. | |
| 8,610,089 B2 | 12/2013 | Donders et al. | |
| 2002/0048096 A1 | 4/2002 | Melzer et al. | |
| 2004/0244963 A1 | 12/2004 | Hazelton | |
| 2005/0057102 A1 | 3/2005 | Totsu et al. | |
| 2005/0168714 A1 | 8/2005 | Renkens et al. | |
| 2008/0073563 A1* | 3/2008 | Novak | G03F 7/70758 250/441.11 |
| 2008/0291413 A1 | 11/2008 | Steijaert et al. | |
| 2010/0163221 A1* | 7/2010 | Ruijl | G05D 23/1934 165/247 |
| 2011/0051267 A1 | 3/2011 | Kierey et al. | |
| 2011/0170078 A1 | 7/2011 | Loopstra et al. | |
| 2011/0211178 A1 | 9/2011 | Sogard et al. | |
| 2011/0317137 A1 | 12/2011 | Donders et al. | |
| 2012/0050709 A1 | 3/2012 | Van Der Pasch | |
| 2012/0267550 A1 | 10/2012 | Donders et al. | |
| 2014/0368800 A1 | 12/2014 | Koevoets et al. | |

FOREIGN PATENT DOCUMENTS

| | | |
|---|---|---|
| JP | H11-243052 A | 9/1999 |
| JP | 2002-189193 A | 7/2002 |
| JP | 2006-526757 A | 11/2006 |

OTHER PUBLICATIONS

International Preliminary Report on Patentability and Written Opinion of the International Search Authority directed to related International Patent Application No. PCT/EP2013/051479, issued Aug. 5, 2014; 6 pages.

International Search Report directed to related International Patent Application No. PCT/EP2013/051480, mailed Oct. 18, 2013; 6 pages.

International Preliminary Report on Patentability and Written Opinion of the International Search Authority directed to related International Patent Application No. PCT/EP2013/051480, issued Aug. 5, 2014; 8 pages.

"Phase-change cooling," Wikipedia.org, accessed at http://en.wikipedia.org/wiki/Computer . . . cooling#Phase-change_cooling on Oct. 24, 2014; 1 page.

U.S. Appl. No. 14/375,264, Koevoets et al., "Lithographic Apparatus With a Metrology System for Measuring a Position of a Substrate Table," filed Jul. 29, 2014.

English Abstract for App. No. JP 05-62871 A, published Mar. 12, 1993; 1 page.

English-Language Abstract for Japanese Patent Publication No. H11-243052 A, published Sep. 7, 1999; 2 pages.

\* cited by examiner

LITHOGRAPHIC APPARATUS AND DEVICE MANUFACTURING METHOD

CROSS-REFERENCE TO RELATED APPLICATIONS

This application claims the benefit of U.S. provisional application 61/592,243, which was filed on 30 Jan. 2012, and of U.S. provisional application 61/652,924, which was filed on 30 May 2012, and of U.S. provisional application 61/710,288, which was filed on 5 Oct. 2012, which are incorporated herein in their entirety by reference.

BACKGROUND

1. Field of the Present Invention

The present invention relates to a lithographic apparatus, and in particular relates to components within a lithographic apparatus and to such components provided with means for controlling deformation of such components. The invention also relates to a metrology system, a method for manufacturing a metrology system and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus will comprise a plurality of different components (by which term is included not only single components but multiple components) assembled into a sub-assembly forming part of the lithographic apparatus.

For example, within the lithographic apparatus it may be important that the position of a moveable item, e.g., the substrate table may be measured with a high precision by a metrology system with respect to a reference position, e.g., the projection system. For this purpose a metrology frame may be connected to at least a portion of the projection system to provide a reference. A reference grid plate may be mounted to the metrology frame and the grid plate may be used by an encoder mounted to the substrate table to measure the position of the substrate table. The grid plate may be sensitive for vibrations caused by turbulence caused by the moving substrate table.

A lithographic apparatus will also be provided with multiple optical elements including for example mirrors and mirror assemblies.

SUMMARY

It is desirable to provide an improved metrology system.

It is desirable to provide components for a lithographic apparatus provided with means for controlling (including avoiding) thermal deformation of components, including but not limited to an improved metrology system and an improved optical element such as a mirror.

According to one aspect of the present invention there is provided a metrology system for measuring a position of at least a moveable item with respect to a reference position and comprising, a metrology frame connected to the reference position, and an encoder connected to the moveable item and constructed and arranged to measure a relative position of the encoder with respect to a reference grid, wherein the reference grid is provided directly on a surface of the metrology frame.

By providing the reference grid directly on the surface of the metrology frame the reference grid may be less sensitive to turbulence caused by, for example the moving substrate table because the metrology frame may be more stiff and heavier than the grid plate and therefore less sensitive for disturbance forces.

In another embodiment, there is provided a device manufacturing method comprising transferring a pattern from a patterning device onto a substrate provided to a substrate table via a projection system of a metrology system, the apparatus comprising a metrology system provided with a metrology frame connected to at least a part of the projection system, wherein the method comprises: measuring a position of the substrate table with an encoder using a reference grid provided directly on a surface of the metrology frame, and projecting the pattern on the substrate with the projection system creating the device.

According to a further embodiment, there is provided a method for manufacturing a metrology system comprising: providing a frame, providing a reference grid directly on the frame, and, connecting the frame to a reference position of the metrology system so as to provide a reference grid to a metrology system to measure a position of a substrate table with respect to the projection system.

According to another aspect of the present invention there is provided a lithographic apparatus component wherein said component is provided with channels for providing a temperature control medium to the said component.

In a preferred embodiment of the invention the component comprises an optical element. Preferably the temperature control medium is provided only to those regions of the optical component used in image formation. Preferably the optical element comprises a mirror.

Preferably the channels are provided parallel to at least one surface of the optical element. Preferably the temperature control medium is a two phase medium.

Preferably the channels are grouped together in channel groups. Preferably each group is provided with its own temperature control system.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
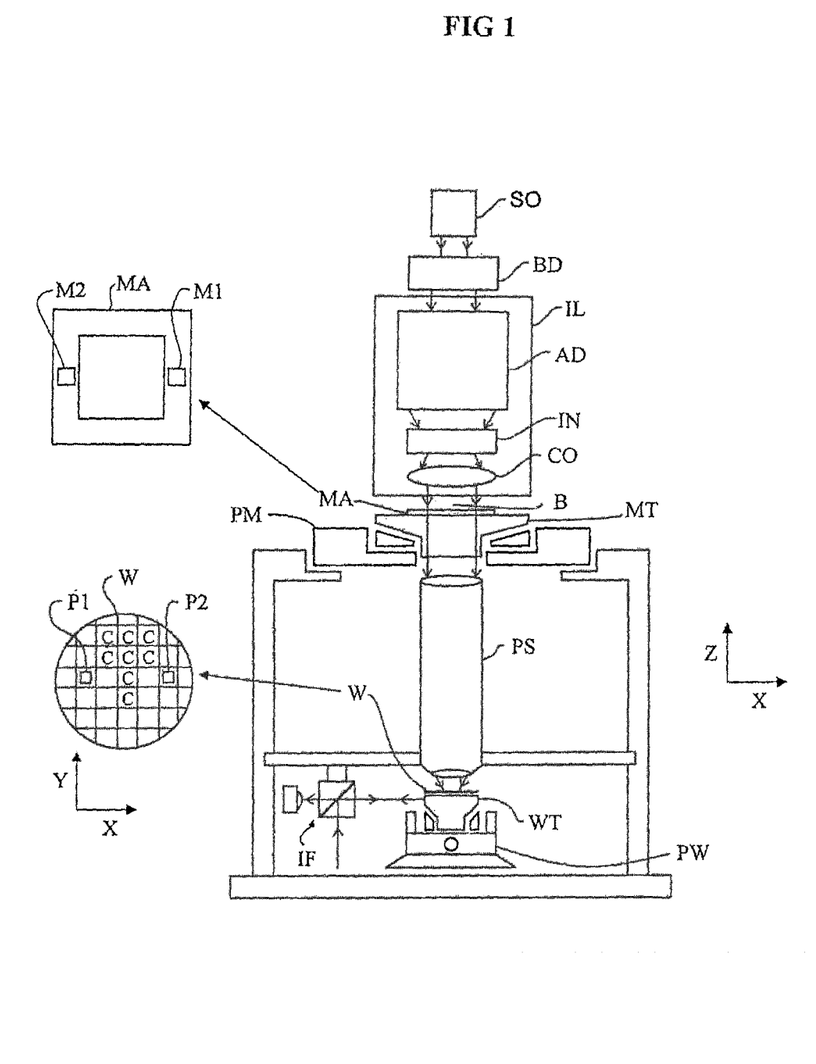
FIG. 1 depicts a lithographic apparatus for using a metrology frame according to an embodiment of the present invention.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate.—An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
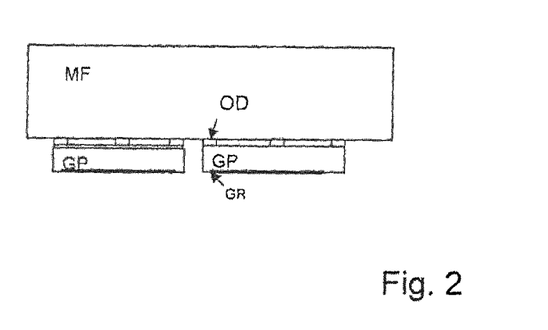
FIG. 2 depicts a metrology frame according to the prior art.

FIG. 2 depicts a metrology frame according to the prior art. The metrology frame MF may be connected to at least a portion of the projection system (PS in FIG. 1) to provide a reference to the projection system. A grid plate GP made of Zerodur™ may be mounted to the metrology frame MF and the grid GR may be used by an encoder provided to the substrate table (WT in FIG. 1) to measure the position of the substrate table with respect to the projection system. Alternatively, the 'gridplate' may be mounted to the substrate table WT (in FIG. 1) and the encoder may be mounted to the metrology frame to measure the position of the substrate table with respect to the metrology frame. The metrology frame MF and the grid-plate GP may be mounted to each other having dynamics in a similar frequency range. An important disturbance force for the metrology frame MF (or indeed any other surface that is to be cooled) may be flow induced vibrations, which may lead to vibration problems in both the metrology frame MF, and due to a resonating mount in vibration problems in the grid plate GP. The grid plate GP may also suffer from vibrations caused by turbulence caused by the moving substrate table. A damper, for example oil damper OD may be used for damping vibrations in the resonating mount between the metrology frame MF and the grid plates GP.

Figure 3:
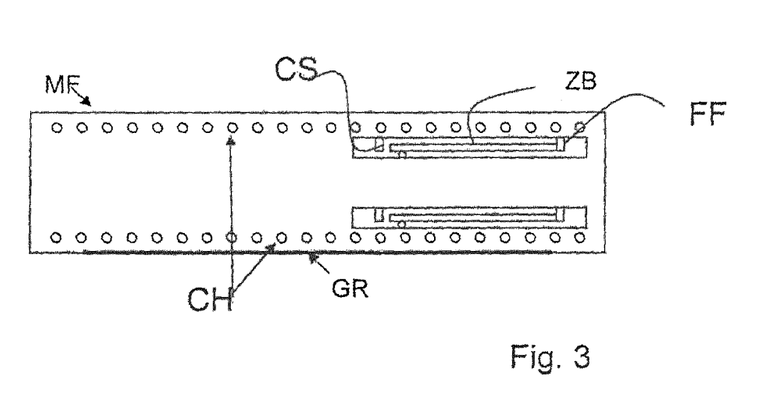
FIG. 3 depicts a metrology frame according to an embodiment.

FIG. 3 depicts an embodiment of the present invention where the lithographic apparatus component comprises a metrology frame. This embodiment of the present invention integrates the functionality of the metrology frame MF and the grid plate GP into one structure. The grid GR is written onto the metrology frame MF. The grid may be protected with a protective layer on top. The metrology frame MF may be made from Aluminium or SiSiC. SiSiC may have better stiffness-properties (i.e., dynamical performance) and a 10 times lower CTE (coefficient of thermal expansion). The metrology frame MF may be provided with channels CH for providing a temperature control medium to the metrology frame MF. The channels may be provided near the surface of the metrology frame so as to circumvent a heat load to reach the center of the metrology frame MF. The temperature control medium may be water or may be a two phase cooling medium, for example $CO_2$ as explained in more detail with reference to U.S. provisional applications Nos. 61/477,496 and U.S. 61/587,344, which are incorporated by reference herein in their entireties. Usage of $CO_2$ solves the current flow induced vibration problem of the metrology frame MF (or other surfaces to be cooled) because there is less current flow of fluids through the channels. The heat transfer efficiency of $CO_2$ is much higher compared to cooling water with a realistic current flow. The aluminum metrology frame MF may have a low thermal sensitivity while it has both a significant thermal mass and more over a very high conduction to the channels, due to the large cooling-area and the significant cooling with the high convection mass. The aluminum metrology frame MF may have a relatively high coefficient of thermal expansion and the frame may expand relatively much assuming a certain temperature rise. This may be solved by preventing temperature rises, for example by using the very high heat-transfer coefficient of $CO_2$ resulting in low milli-Kelvin rises. Further it may be solved or compensated for by measuring the deformation with a deformation measurement system. The deformation may be measured by having a deformation measurement system comprising a bar ZB, for example made of Zerodur™ provided to the metrology frame. The bar ZB may be fixed at one point FF to the rest of the metrology frame MF and at the other side may be freely moveable with respect to the rest of the metrology frame. With a sensor, for example a capacitive sensor CS the relative movement between the Zerodur™ end point and the metrology frame MF may be measured. For this purpose the capacitive sensor may comprise a first electrode provided to a first portion of the metrology frame and a second electrode to a second portion of the metrology frame e.g., the bar ZB and the capacitive sensor may determine a displacement between the electrodes to measure the deformation of the metrology frame. The measured deformation may be used to adjust the metrology system so as to compensate for the deformation of the metrology frame. Two deformation measurement systems in first direction are depicted but more may be used to measure the deformation in multiple directions. For example the deformation may be measured in a second direction perpendicular to the first direction so as to also compensate deformations in the second direction.

Figure 4:
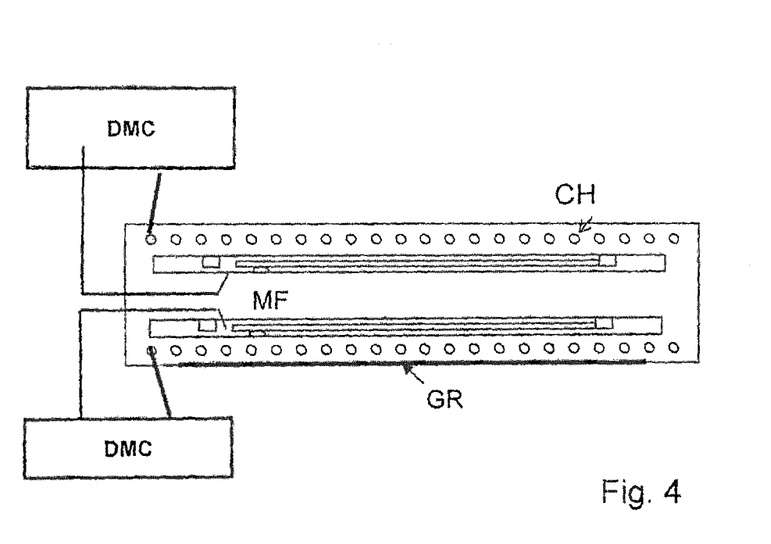
FIG. 4 depicts a metrology frame according to a further embodiment.

FIG. 4 depicts a further embodiment of the present invention in the form of a metrology frame. Again, the deformation is measured similar as in FIG. 3 with a deformation measurement system. The measurement result may be forwarded to a deformation controller DMC operable connected to the deformation measurement system. As a function of the measured deformation a pressure control system constructed and programmed to adjust a pressure of a two phase medium in a group of channels may adjust a temperature of the group of channels by adjusting the pressure. Because of the very high heat-transfer coefficient of a two phase medium we may control very small temperature rises and therefore deformations. Note that the impact of a local heat loads may be very well counteracted by the $CO_2$. Because the effect of a more local heat load results in a locally higher flux the heat-transfer coefficient of the 2-phase cooling medium increases, counteracting the impact of hot-spots. The metrology frame may be provided with multiple groups of channels with their individual deformation controllers DMC, temperature controls systems and deformation measurement systems to control the temperature in each group individually to control deformation of the metrology frame in multiple degrees of freedom. The channels may be grouped together in channel groups and each group may be provided with its own temperature control system connected with its own deformation controller DMC. For example, in the metrology frame of FIG. 4 the deformation controller DMC in the top portion of the metrology frame MF may be used to control the channel group CH in the top portion of the metrology frame to minimize deformation.

Figure 5:
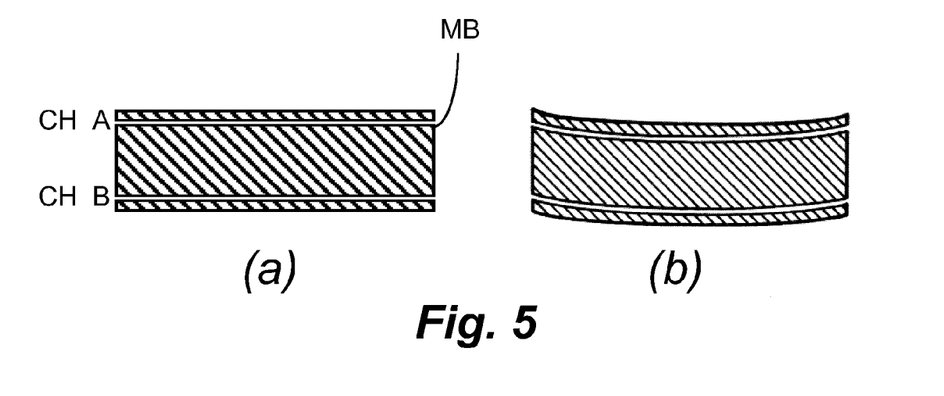
FIGS. 5(a) and 5(b) depict a mirror according to an embodiment.

FIGS. 5(a) and 5(b) show another embodiment of the invention in which the lithographic apparatus part comprises an optical element. In this embodiment the optical element is a mirror. In this embodiment the mirror may comprise a mirror body MB formed of a material of low coefficient of thermal expansion (CTE) such as a glass or ceramic material. One surface of the mirror body MB will be provided with a reflective coating as is known in the art. The mirror body is provided with two channels CH A and CH B that extend parallel and close to the surfaces of the mirror body MB. A temperature control medium which may be water but which is preferably a two phase medium such as $CO_2$ is passed through the two channels CH A and CH B. If the temperature of the temperature control medium flowing through channel CH A is the same as the temperature of the control medium flowing through channel CH B then the mirror will remain flat as shown in FIG. 5(a). However, if there is a difference in temperature between the temperature control medium in one channel and the temperature control medium in the other channel, then the mirror may be caused to deform. For example, FIG. 5(b) shows a deformation when the temperature in CH A is less than CH B.

It will be understood that FIGS. 5(a) and 5(b) show the mirror in section and therefore show only two channels CH A and CH B close to the two respective surfaces. In practice there may be multiple parallel channels CH A and multiple parallel channels CH B such that there are temperature control channels spread over substantially the entire surfaces of the mirror body MB. Equally it may be possible to locate the temperature control channels only adjacent areas of the mirror surfaces where such control is particularly required.

While a single phase temperature control medium such as water may be employed, a two phase medium is preferred as compared with a one phase medium only a small flow is required to transport large heat flow resulting in far less flow-induced mirror deformation.

The embodiment of FIGS. 5(a) and (b) is particularly suited to situations where it is desired to avoid thermal mirror deflection. However, if the low CTE material is replaced with a material of a higher CTE, such as aluminium, the same principles can be used to enable controlled desired mirror deflection.

Figure 6:
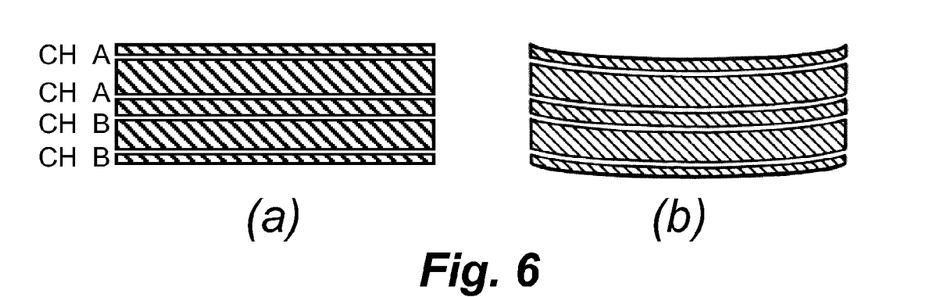
FIGS. 6(a) and 6(b) depict a mirror according to a further embodiment.

In the embodiment of FIGS. 6(a) and 6(b) the mirror body MB is made of a material with a higher coefficient of thermal expansion, such as aluminium. In this embodiment there are provided a group of two first temperature control channels CH A located at different distances from the surface of the mirror body MB, and a group of two second temperature control channels CH B also located at different distances from the surface of the mirror body. By selectively providing temperature control medium to the two groupings of different temperatures the mirror can be caused to deform as shown in FIG. 6(b). One option here would be to provide one system for supplying CO2 to the A group of channels, and a second system for supplying CO2 to the B group of channels.

Figure 7:
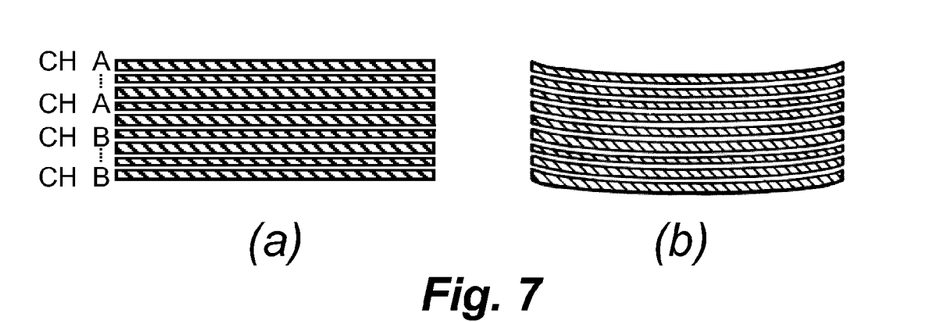
FIGS. 7(a) and 7(b) depict a mirror according to a further embodiment.

Another option is shown in FIGS. 7(a) and 7(b) where the groups of channels can be increased in number to provide a greater degree of control. It would also be possible to provide more than two groups of channels and each group of channels would be provided with its own CO2 supply for independent temperature control. A greater number of channel groups provides for smaller temperature differences between them resulting in lower stress between channels. This also results in a lower heat flux of the whole system because temperature differences are smaller over the same thickness of material. This provides lower energy consumption and better thermal control.

Figure 8A:
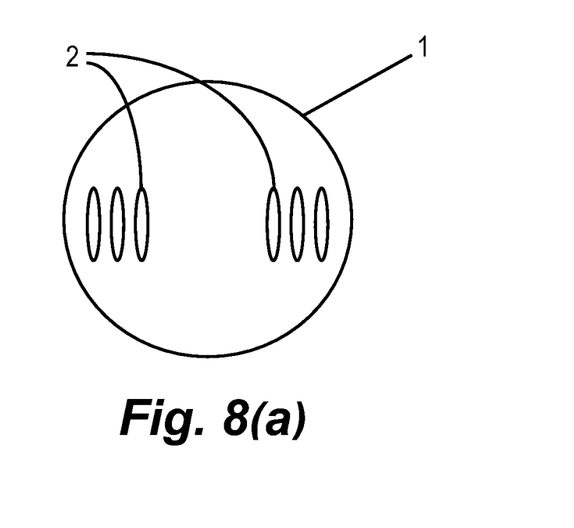
FIGS. 8(a) and 8(b) depict a mirror according to a further embodiment.
Figure 8B:
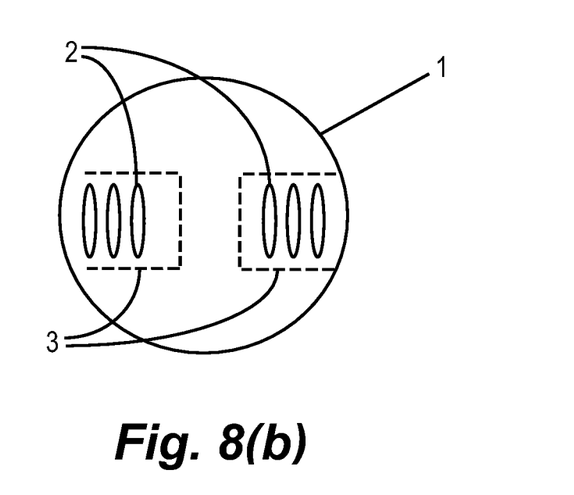

It will also be understood that it may not be necessary to provide thermal control over the entirety of the mirror (or other component) where in use thermal control of only selected regions is necessary. This is illustrated schematically in FIGS. 8(a) and 8(b). FIG. 8(a) depicts schematically a mirror 1 where in use images 2 are formed at—in this example—left and right regions. If the images are consistently formed only in these regions then it may be sufficient to provide thermal control to these regions only. This is illustrated in FIG. 8(b) which shows the areas 3 used in exposure and image formation. The thermal control may be applied to only these regions, and other regions of the mirror may be provided either with no thermal control or with less sensitive thermal control.

It will be understood that the optical element could be provided with a deformation measurement system similar to that described previously with reference to the metrology system. That is to say that the optical element may be provided with a deformation measurement system provided with a capacitive sensor comprising a first electrode provided to a first portion of the optical element and a second electrode to a second portion of the optical element, with the capacitive sensor determining a displacement between the electrodes to determine the deformation of the element. Alternatively the optical element may be provided with an interferometer for measuring a deformation. There may also be provided a deformation controller operably connected to the deformation measurement system and the temperature control system may be a pressure control system constructed and programmed to adjust a pressure of the two phase medium in a group of channels such as to adjust a temperature of the group of channels as a function of the measured deformation by the deformation measurement system.

Alternatively deformation of an optical element may be determined indirectly by determining the position, focus or other optical parameters of an image and in the event of an error in such parameters being detected generating a correction signal that may be fed back to the temperature control system to make a correcting adjustment.

The use of a two phase (liquid and gas) temperature control medium such as CO2 is particularly preferred because it provides a faster response time than a one phase medium such as water because in a two phase system the local pressure dictates immediately the local fluid temperature and thus the critical speed is the speed of sound in the liquid phase rather than the speed of the cooling fluid in the channel which is the critical speed in a one phase liquid only system. A two phase system is therefore very fast and results in equal distribution over the whole surface in contact with the two phase medium. The groups of channels will be provided with temperature control medium supplied from control systems that can adjust the temperature of the temperature control medium in response to feedback data that may be obtained, for example, by means of a deformation measurement system as discussed above or in response to a focus or other optical parameter control system.

It will of course be understood that while the optical element in the form of a mirror is particularly useful for use in lithographic apparatus, it could have many other possible uses including for example focus control of mirrors in other forms of apparatus such as lasers and telescopes. At least in preferred embodiments the present invention enables extremely good thermal conditioning of mirrors (with a temperature control resolution in terms of mKelvins), with very low flow noise and fast active control.

Furthermore, in preferred embodiments of the invention where there are multiple two-phase fluid pressure control loops it is possible to control deformation of the mirror with n degrees of freedom. In particular, where there are 1+n control loops with the cooling channels suitable positioned to avoid crosstalk, the mirror can be deformed with n degrees of freedom by controlling the local temperatures of the channels.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following clauses and claims and their equivalents.

1. A metrology system for measuring a position of at least a moveable item with respect to a reference and comprising;
   a metrology frame connected to the reference; and
   an encoder connected to the moveable item and constructed and arranged to measure a relative position of the encoder with respect to a reference grid, wherein the reference grid is provided directly on a surface of the metrology frame.

2. The metrology system according to clause 1, wherein the metrology frame is provided with channels for providing a temperature control medium to the metrology frame.

3. The metrology system according to clause 2, wherein the medium is a two phase medium and the channel functions as a heat pipe.

4. The metrology system according to clause 3, wherein the two phase medium is carbon dioxide.

5. The metrology system according to any of clauses 2 to 4, wherein the channels are provided near the surface of the metrology frame.

6. The metrology system according to any of clauses 2 to 5, wherein the channels are grouped together in channel groups, each group provided with its own temperature control system.

7. The metrology system according to any of clauses 1 to 6, wherein the metrology frame is provided with a deformation measurement system for measuring a deformation of the metrology frame.

8. The metrology system according to clause 7, wherein the deformation measurement system is provided with a capacitive sensor comprising a first electrode provided to a first portion of the metrology frame and a second electrode to a second portion of the metrology frame and the capacitive sensor determines a displacement between the electrodes to determine the deformation of the metrology frame.

9. The metrology system according to clause 7, wherein the deformation measurement system is provided with an interferometer for measuring a deformation of the metrology frame.

10. The metrology system according to any of clauses 7 to 9, when dependent on clause 6, wherein the apparatus is provided with a deformation controller operably connected to the deformation measurement system and the temperature control system is a pressure control system constructed and programmed to adjust a pressure of the two phase medium in a group of channels such as to adjust a temperature of the group of channels as a function of the measured deformation by the deformation measurement system.

11. The metrology system according to any of the preceding clauses wherein the metrology frame comprises a metal, such as aluminum.

12. The metrology system according to any of the preceding clauses, wherein the reference grid is etched in the metrology frame.

13. The metrology system according to any of the preceding clauses, wherein the metrology frame is provided with a protective layer on top of the reference grid.

14. A lithographic projection apparatus comprising the metrology system according to any of the preceding clauses, wherein the moveable item is a substrate table, the reference position is a projection system and the metrology system is used to measure a position of the substrate table with respect to the projection system.

15. A device manufacturing method comprising transferring a pattern from a patterning device onto a substrate provided to a substrate table via a projection system of a metrology system, the apparatus comprising a metrology system provided with a metrology frame connected to at least a part of the projection system, wherein the method comprises:

measuring a position of the substrate table with an encoder using a reference grid provided directly on a surface of the metrology frame; and projecting the pattern on the substrate with the projection system creating the device.

16. A method for manufacturing a metrology system comprising:

providing a frame;

providing a reference grid directly on the frame; and, connecting the frame to a reference position of the metrology system so as to provide a reference grid to a metrology system to measure a position of a substrate table with respect to the projection system.

17. The method according to clause 16, wherein the method comprises providing a protective layer on the reference grid on the frame.

18. A metrology system comprising:

a metrology frame connected to a reference; and an encoder connected to a moveable item and constructed and arranged to measure a relative position of the encoder with respect to a reference grid, wherein the reference grid is provided directly on a surface of the metrology frame.

19. The metrology system according to clause 18, wherein the metrology frame is provided with channels for providing a temperature control medium to the metrology frame.

20. The metrology system according to clause 19, wherein the medium is a two phase medium and the channel functions as a heat pipe.

21. The metrology system according to clause 20, wherein the two phase medium is carbon dioxide.

22. The metrology system according to clause 19, wherein the channels are provided near the surface of the metrology frame.

23. The metrology system according to clause 19, wherein the channels are grouped together in channel groups, each group provided with its own temperature control system.

24. The metrology system according to clause 18, wherein the metrology frame is provided with a deformation measurement system for measuring a deformation of the metrology frame.

25. The metrology system according to clause 24, wherein the deformation measurement system further comprising:

a capacitive sensor comprising a first electrode provided to a first portion of the metrology frame and a second electrode to a second portion of the metrology frame, wherein the capacitive sensor determines a displacement between the electrodes to determine the deformation of the metrology frame.

26. The metrology system according to clause 24, wherein the deformation measurement system is provided with an interferometer for measuring a deformation of the metrology frame.

27. The metrology system according to clauses 24, wherein the apparatus further comprises:

a deformation controller operably connected to the deformation measurement system;

wherein the temperature control system is a pressure control system constructed and programmed to adjust a pressure of the two phase medium in a group of channels such as to adjust a temperature of the group of channels as a function of the measured deformation by the deformation measurement system.

28. The metrology system according to clause 18, wherein the metrology frame comprises a metal or aluminum.

29. The metrology system according to clause 18, wherein the reference grid is etched in the metrology frame.

30. The metrology system according to clause 18, wherein the metrology frame is provided with a protective layer on top of the reference grid.

31. The metrology system according to clause 18, wherein the moveable item is a substrate table, the reference position is a projection system and the metrology system is used to measure a position of the substrate table with respect to the projection system.

32. A device manufacturing method that transfers a pattern from a patterning device onto a substrate provided to a substrate table via a projection system of a metrology system, the apparatus comprising a metrology system provided with a metrology frame connected to at least a part of the projection system, wherein the method comprises:

measuring a position of the substrate table with an encoder using a reference grid provided directly on a surface of the metrology frame; and projecting the pattern on the substrate with the projection system creating the device.

33. A method for manufacturing a metrology system comprising:

providing a frame;

providing a reference grid directly on the frame; and, connecting the frame to a reference position of the metrology system so as to provide a reference grid to a metrology system to measure a position of a substrate table with respect to the projection system.

34. The method according to clause 33, wherein the method comprises providing a protective layer on the reference grid on the frame.

What is claimed is:

1. A lithographic apparatus component comprising:

channels configured to allow a temperature control medium to flow through the lithographic apparatus component, wherein:

a first one of the channels is configured to allow a first portion of the temperature control medium to flow that has a first temperature, and a second one of the channels is configured to allow a second portion of the temperature control medium to flow that has a second temperature; and a control system configured to control the first and second temperatures to deform first and second surfaces of the lithography apparatus component, wherein:

the first and second surfaces are opposite to each other; and the first and second ones of the channels are positioned between the first and second surfaces.

2. The lithographic apparatus component as claimed in claim 1, wherein:

the temperature control medium comprises a two phase medium; and the channels are configured to operate as heat pipes.

3. The lithographic apparatus component as claimed in claim 2, wherein the two phase medium comprises carbon dioxide.

4. The lithographic apparatus component as claimed in claim 1, wherein the control system is configured to control the first and second temperatures based on a measured deformation of the lithography apparatus component.

5. The lithographic apparatus component as claimed in claim 1, wherein the channels are configured to run parallel to the first and second surfaces of the lithographic apparatus component.

6. The lithographic apparatus component as claimed in claim 1, wherein the channels are grouped together in channel groups, each group being coupled to the control system.

7. The lithographic apparatus component as claimed in claim 1, further comprising a deformation measurement system configured to measure a deformation of the lithography apparatus component, the deformation measurement system comprising a measurement bar having first and second ends, the first end being coupled to the lithography apparatus component and the second end being configured to move freely with respect to the lithography apparatus component.

8. The lithographic apparatus component as claimed in claim 1, further comprising a deformation measurement system configured to measure a deformation of the lithography apparatus component, the deformation measurement system comprising:

a first electrode having first and second ends, the first end being coupled to a first portion of the lithography apparatus component and the second end being configured to move freely with respect to the lithography apparatus component; and a second electrode coupled to a second portion of the lithography apparatus component, wherein the deformation measurement system is configured to determine a displacement between the first and second electrodes to determine a deformation of the lithography apparatus component.

9. The lithographic apparatus component as claimed in claim 1, further comprising an interferometer configured to measure a deformation of the lithography apparatus component.

10. The lithographic apparatus component as claimed in claim 1, further comprising a deformation measurement system configured to measure a deformation of the lithography apparatus component, wherein the control system is configured to adjust a pressure of the temperature control medium to adjust the first and second temperatures based on the measured deformation by the deformation measurement system.

11. The lithographic apparatus component as claimed in claim 1, comprising a metrology system.

12. The lithographic apparatus component as claimed in claim 11, wherein the control system is configured to control the first and second temperatures based on a response from another control system.

13. The lithographic apparatus component as claimed in claim 1, comprising an optical element.

14. The lithographic apparatus component as claimed in claim 13, wherein the optical element comprises a mirror.

15. The lithographic apparatus component as claimed in claim 1, wherein the control system is configured to control the first and second temperatures only in regions of the lithography apparatus component corresponding to image formation regions of the lithography apparatus component.

16. The lithographic apparatus component as claimed in claim 1, wherein:

the control system is configured to control the first and second temperatures based on a feedback control signal; and the feedback control signal corresponds to a parameter error of an image.

17. The lithographic apparatus component as claimed in claim 1, wherein the control system comprises 1+n pressure control loops configured to control deformation of the lithography apparatus component with n degrees of freedom, n being an integer.

18. A lithographic apparatus comprising:

a substrate table configured to hold a substrate;

a projection system configured to image a pattern onto the substrate; and a component comprising:

channels configured to allow a temperature control medium to flow through the component, wherein:

a first one of the channels is configured to allow a first portion of the temperature control medium to flow that has a first temperature, and a second one of the channels is configured to allow a second portion of the temperature control medium to flow that has a second temperature; and a control system configured to control the first and second temperatures to deform first and second surfaces of the lithography apparatus component, wherein:

the first and second surfaces are opposite to each other; and the first and second ones of the channels are positioned between the first and second surfaces.

19. The lithographic apparatus as claimed in claim 18, wherein the component further comprises a deformation measurement system configured to measure a deformation of the component, the deformation measurement system comprising a measurement bar having first and second ends, the first end being coupled to the component and the second end being configured to move freely with respect to the component.

20. The apparatus as claimed in claim 18, wherein the control system is configured to control the first and second temperatures only in regions of the component corresponding to image formation regions of the component.

* * * * *